(12) United States Patent
Zeng et al.

(10) Patent No.: US 7,910,267 B1
(45) Date of Patent: Mar. 22, 2011

(54) METHOD AND SYSTEM FOR PROVIDING OPTICAL PROXIMITY CORRECTION FOR STRUCTURES SUCH AS A PMR NOSE

(75) Inventors: Xianzhong Zeng, Fremont, CA (US); Hai Sun, Milpitas, CA (US); Hongping Yuan, Fremont, CA (US); Dujiang Wan, Fremont, CA (US); Ling Wang, Hercules, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 157 days.

(21) Appl. No.: 12/333,699

(22) Filed: Dec. 12, 2008

(51) Int. Cl.
*G03F 1/00* (2006.01)
(52) U.S. Cl. .......................... 430/5; 430/320
(58) Field of Classification Search ...... 430/5, 311–313, 430/320; 716/19, 21
See application file for complete search history.

(56) References Cited

U.S. PATENT DOCUMENTS

| | | | |
|---|---|---|---|
| 5,242,770 A | 9/1993 | Chen et al. | |
| 5,849,440 A * | 12/1998 | Lucas et al. | 430/5 |
| 6,127,071 A | 10/2000 | Lu | |
| 6,178,066 B1 | 1/2001 | Barr | |
| 6,255,040 B1 * | 7/2001 | Sasaki | 430/320 |
| 6,255,130 B1 * | 7/2001 | Kim | 438/30 |
| 6,280,887 B1 | 8/2001 | Lu | |
| 6,492,078 B1 | 12/2002 | Ohnuma | |
| 6,497,825 B1 | 12/2002 | Kamijima | |
| 7,100,145 B2 | 8/2006 | Shi et al. | |
| 7,141,338 B2 | 11/2006 | Chen et al. | |
| 7,252,909 B2 | 8/2007 | Shin et al. | |
| 7,736,823 B1 * | 6/2010 | Wang et al. | 430/5 |
| 2002/0157081 A1 | 10/2002 | Shi et al. | |
| 2006/0269848 A1 * | 11/2006 | Setta | 430/5 |
| 2007/0134597 A1 | 6/2007 | Lauchlan | |
| 2007/0279802 A1 | 12/2007 | Sasaki et al. | |
| 2008/0073718 A1 * | 3/2008 | Lee et al. | 257/347 |
| 2008/0206656 A1 * | 8/2008 | Laidig et al. | 430/5 |
| 2009/0068572 A1 * | 3/2009 | Lv et al. | 430/5 |

\* cited by examiner

*Primary Examiner* — Stephen Rosasco
*Assistant Examiner* — Stewart A Fraser

(57) ABSTRACT

An optical mask for providing a pattern for portion of an electronic device, such as a magnetic recording transducer, is disclosed. The optical mask includes a device feature and at least one detached correction feature. The device feature includes a corner corresponding to a device corner of the pattern. The device corner has an angle of greater than zero degrees and less than one hundred eighty degrees. The at least one detached correction feature resides in proximity to but is physically separated from the corner. Each of the at least one detached correction feature is sub-resolution.

26 Claims, 7 Drawing Sheets

US 7,910,267 B1

METHOD AND SYSTEM FOR PROVIDING OPTICAL PROXIMITY CORRECTION FOR STRUCTURES SUCH AS A PMR NOSE

BACKGROUND OF THE INVENTION

Optical masks are used in fabrication of a variety of electronic devices, including magnetic recording transducers. For example, FIG. 1 depicts air-bearing surface (ABS) view of a conventional perpendicular magnetic recording (PMR) transducer 10 used in recording a PMR media (not shown). The conventional PMR transducer 10 is typically used as a write head in a merged head including the conventional PMR transducer 10 and a read head. The conventional PMR transducer 10 includes a conventional first pole (P1) 12, insulator 14, insulator 16, a conventional PMR pole (main pole) 18, write gap 20, and shield 22. The PMR pole 18 has a negative angle, $\phi$. Thus, the top of the conventional PMR pole 18 is wider than the bottom of the PMR pole 18.

FIG. 2 depicts a conventional optical mask 30 for fabricating a portion of an electronic device, such as the conventional pole 18 of the conventional PMR transducer 10. The conventional optical mask 30 is used to transfer the pattern of the conventional optical mask 30 to a photoresist mask, and thus to the conventional PMR transducer 10. The conventional optical mask 30 has a shape corresponding to the shape desired to be developed. Consequently, the optical mask 30 includes a region 32 corresponding to a nose region, corners 34A and 34B, and a flare angle, $\phi$. The region 32 might be transparent, while the remaining regions are opaque. In another implementation, the conventional optical mask 30 may be opaque in the region 32 and transparent in the remaining regions.

FIG. 3 depicts a conventional resist mask 40 formed using the conventional optical mask 30. A layer of resist (not shown) is typically spun onto the surface of the conventional PMR transducer 10. The photoresist layer is developed using the conventional optical mask 30 to block a portion of the light used as well as light of the appropriate wavelength. The conventional resist mask 40 is developed from the layer of photoresist. Because of the use of the conventional mask 30, the conventional resist mask 40 includes a trench having a nose region 42 and arcs 44A and 44B. The conventional resist mask 40 covers a portion of the conventional PMR transducer 10 during fabrication, allowing the conventional PMR pole 18 to be formed therein.

FIG. 4 depicts a top view of a portion of the conventional pole 18. Near the ABS, the conventional PMR pole 18 terminates in a nose 19. The conventional PMR pole 18 thus flares outward from the nose 19 at a flare angle, $\phi$, forming corners 21A and 21B. The flare angle, $\phi$, is typically desired to be approximately one hundred and fifty degrees.

Referring to FIGS. 1-4, although the conventional mask 30 and conventional resist mask 40 may be used to form the conventional PMR pole 18, there are drawbacks. In particular, the shape of the nose 19 may not be well controlled. Although the conventional mask 30 includes relatively sharp corners 34A and 34B, the corresponding regions of the conventional resist mask, arcs 44A and 44B, are rounded. It is believed that this rounding is due to optical proximity effects during exposure of the resist mask 40. Even though the desired obtuse angle, $\phi$, may be achieved, the rounding adversely affects the PMR pole 18. Because of the rounding in the regions 44A and 44B, the conventional PMR pole 18 also has rounded corners 21A and 21B, respectively. Rounding of the corners 21A and 21B results in variations in the nose 19. For example, variations in the write track width and shape of the pole 18 may result. Consequently, performance of the PMR transducer 10, as well as the performance of other electronic devices also desired to have sharper corners, may suffer.

BRIEF SUMMARY OF THE INVENTION

An optical mask for providing a pattern for portion of an electronic device, such as a magnetic recording transducer, is disclosed. The optical mask includes a device feature and at least one detached correction feature. The device feature includes a corner corresponding to a device corner of the pattern. The device corner has an angle of greater than zero degrees and less than one hundred eighty degrees. The at least one detached correction feature resides in proximity to but is physically separated from the corner. Each of the at least one detached correction feature is sub-resolution.

DETAILED DESCRIPTION OF THE INVENTION

Figure 1:
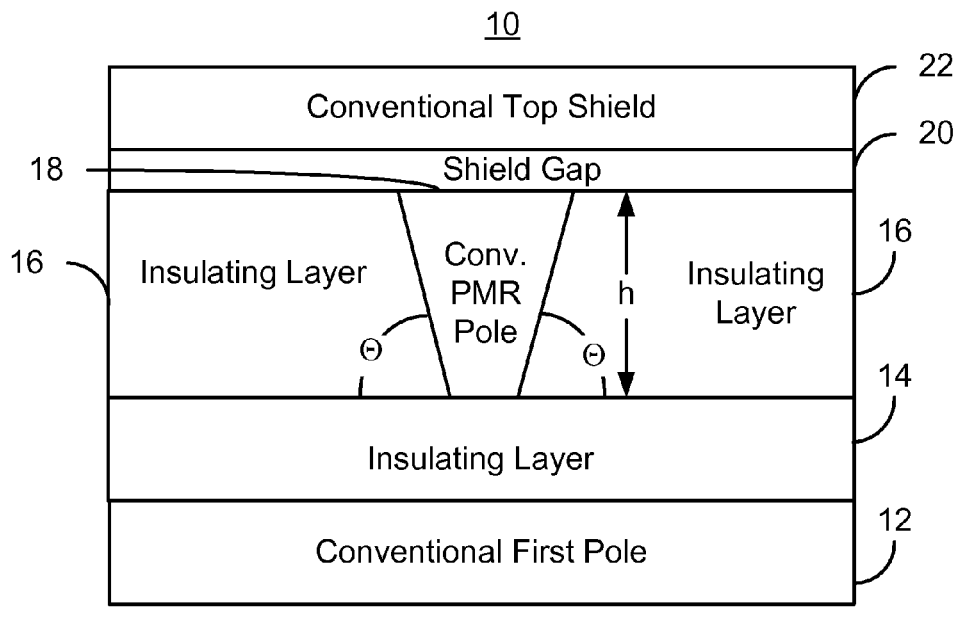
FIG. 1 depicts an ABS view of a conventional PMR pole for a conventional PMR transducer.
Figure 2:
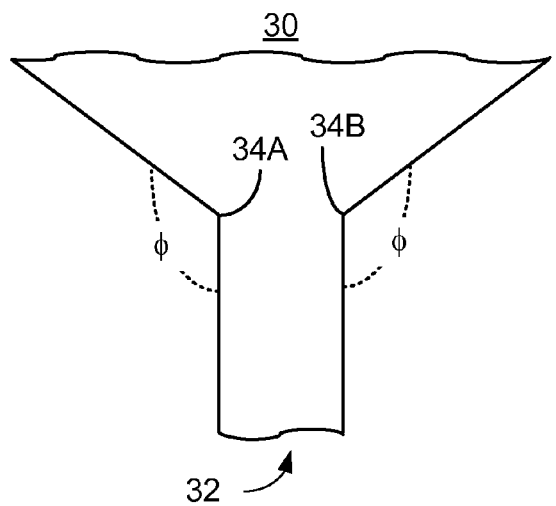
FIG. 2 depicts a conventional OPTICAL mask used in forming the conventional PMR pole.
Figure 3:
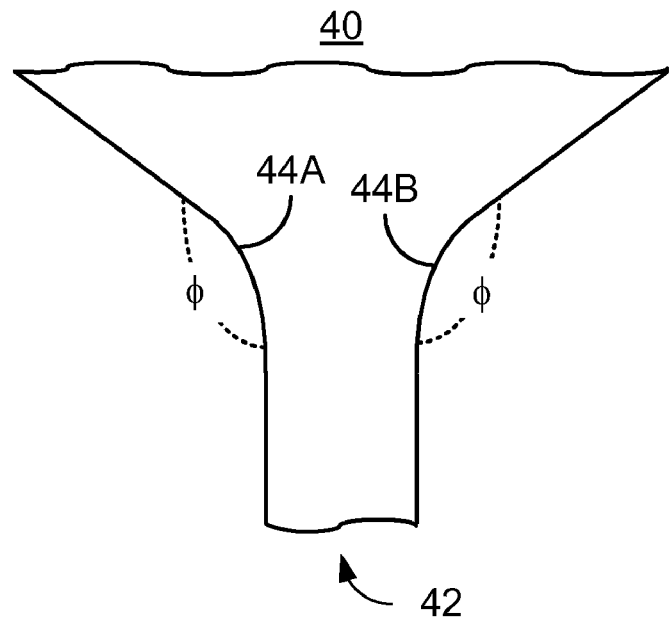
FIG. 3 depicts a conventional resist mask fabricated using the conventional mask.
Figure 4:
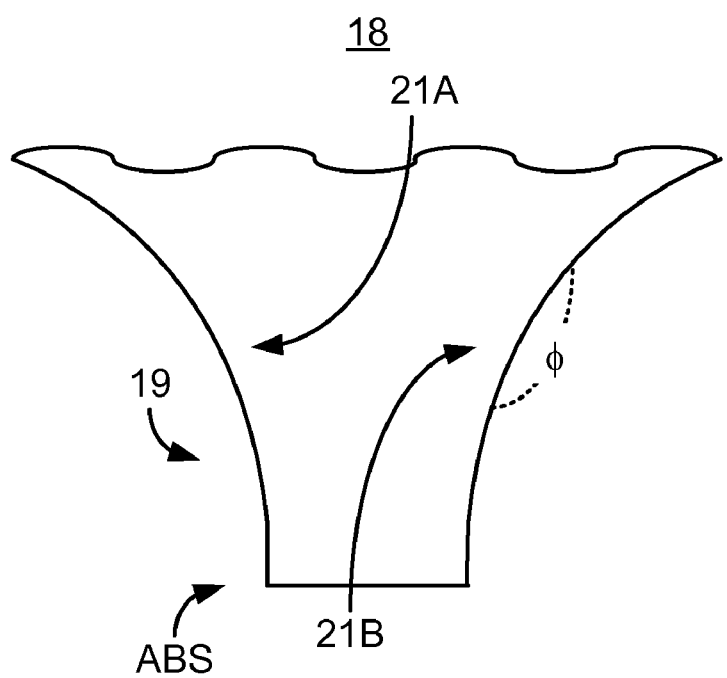
FIG. 4 depicts a top view of a conventional pole of a PMR transducer.
Figure 5:
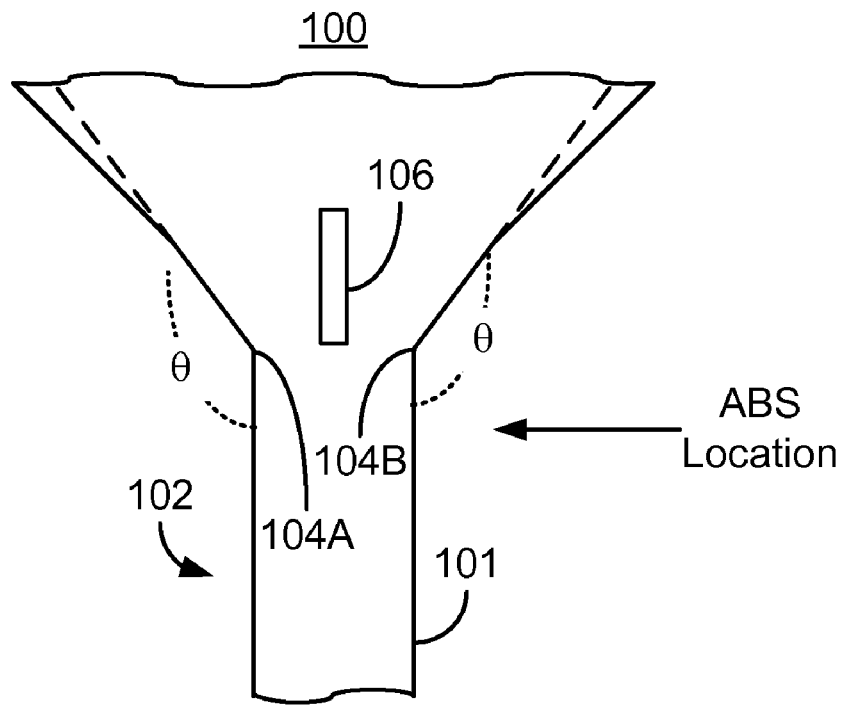
FIG. 5 depicts an exemplary embodiment of an optical mask used in fabricating structures having a corner, such as a PMR pole.

FIG. 5 depicts an exemplary embodiment of an optical mask 100 used in fabricating electronic devices having a corner, such as a PMR pole of a magnetic transducer. For clarity, FIG. 5 is not drawn to scale. In the embodiment shown, the optical mask 100 is used in fabricating the PMR pole. However, in other embodiments, the optical mask 100 may be used in fabricating other electronic devices. The mask 100 is termed an optical mask because electromagnetic radiation is used in connection with the optical mask 100. Consequently, the optical mask 100 need not be limited to use with the visible spectrum. The optical mask 100 includes a pattern for providing the device. For example, in the embodiment shown, the pattern includes a device feature 101. The edges of the device feature 101 are shown in solid lines. The device feature 101 shown is opaque and may be formed of a material such as Cr on an underlying quartz substrate. The remaining portions of the mask 100 shown may be transparent, for example including the underlying quartz substrate. However, in another embodiment, the device feature 101 may be transparent and a remaining portion of the optical mask 100 may be opaque.

The device feature 101 of the mask 100 includes a nose region 102 and corners 104A and 104B. Each corner 104A and 104B has a flare angle, $\theta$, associated with it. The flare angle, $\theta$, is greater than zero degrees and less than one hundred eighty degrees. In other embodiments, the flare angle may be different. For example, in some embodiments, the flare angle might be at least one hundred ten degrees and not more than one hundred sixty degrees. Also shown are dotted lines which indicated that portions of the feature 101 may have other angles associated with them.

The mask 100 also includes rectangular detached correction feature 106. The detached correction feature 106 corresponds to the corners 104A and 104B. The correction feature 106 is considered to be detached because the correction feature is not physically connected to the corner 104A or the corner 104B, for which the correction feature 106 is desired to provide optical proximity effect correction. In the embodiment shown, the detached correction feature 106 is a bar, or rectangle. However, other shapes, including shapes that may include curves, might be used. In addition, the shapes used may or may not be symmetric, depending upon the desired correction. Further, the location of the detached correction feature 106 is shown as symmetric because it is centrally located between the corners 104A and 104B. However, in another embodiment, the detached correction feature may not be symmetrically located. In the embodiment shown, the correction feature 106 is an aperture in the device feature 101. However, in another embodiment, the detached correction feature 106 may be opaque and at least partially surrounded by transparent material. The detached correction feature 106 is sub-resolution in size for the electromagnetic radiation being used in performing lithography with the optical mask 100. Thus, the width and length of the detached correction feature 106 are such that the detached correction feature is not printed on the mask (not shown in FIG. 5). In one embodiment, for example, the length of the detached correction feature 106 is not more than three hundred to four hundred nanometers and the width is significantly less than the length. For example, the width may be not more than one hundred nanometers. However, in another embodiment, the length may be different. For example, the length of the detached correction feature 106 may be larger if the width is sufficiently small that the detached correction feature 106 is still not printed. The detached correction feature is in proximity to the corner(s) 104A/104B for which optical proximity correction is desired. For example, in one embodiment, the bottom of the detached correction feature 106 is not more than thirty nanometers above the apex of the corners 104A and 104B. However, the location, size, and/or other aspects of the detached correction feature 106, including its proximity to the corners 104A and 104B, depends upon the device being fabricated and the desired optical correction. For example, the size of the device, the size of the angles for the corners, and other features of the device may be accounted for in determining the size, location, and/or shape of the detached correction feature 116. Finally, although the only the detached correction feature 106 is depicted, other correction features might also be provided. For example, rectangular or other shaped serifs (not shown) may be attached to the corner(s) 104A and/or 104B in order to improve the correction provided by the detached correction feature 106.

In operation, the detached correction feature 106 modulates the intensity of the electromagnetic radiation used in performing lithography using the optical mask 100. Although the detached correction feature 106 shown is an aperture, the intensity of electromagnetic radiation may be increased in some regions and decreased in others. At least one effect of the modulation in intensity is to improve the sharpness of the corners in a mask and device that correspond to the corners 104A and 104B. Other effects might but need not include improvement in other edges of the device feature 101.

Figure 6:
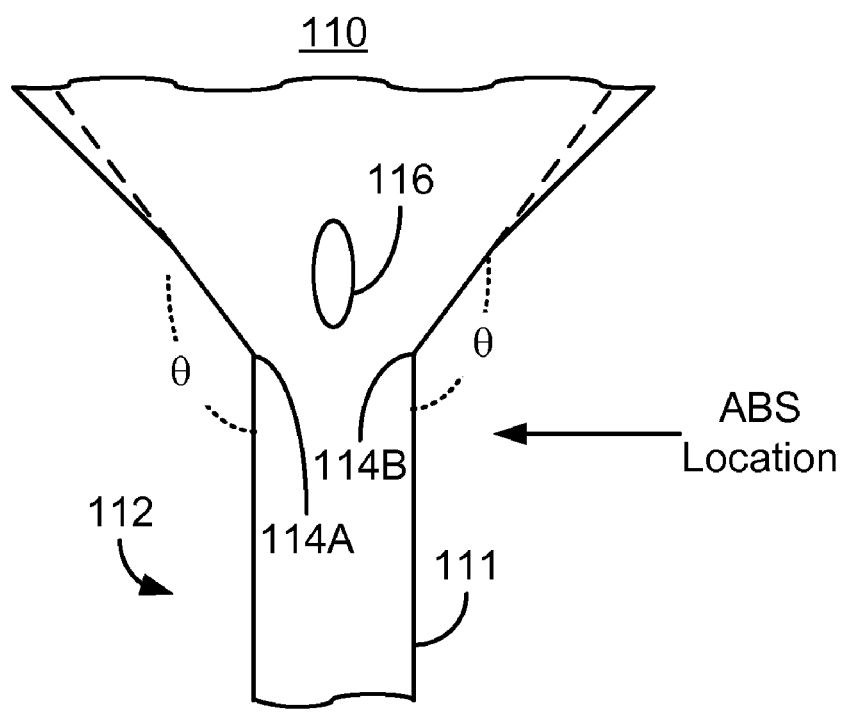
FIG. 6 depicts another exemplary embodiment of an optical mask used in fabricating structures having a corner, such as a PMR pole.

FIG. 6 depicts another exemplary embodiment of an optical mask 110 used in fabricating electronic devices including structures having a corner, such as a PMR pole. For clarity, FIG. 6 is not drawn to scale. The optical mask 110 corresponds to the optical mask 100. Consequently, analogous components have similar labels. The optical mask 110 thus includes a device feature 111 including a nose region 112, corners 114A and 114B, and detached correction feature 116 corresponding to device feature 101 including a nose region 102, corners 104A and 104B, and detached correction feature 106, respectively. Thus, the optical mask 110, device feature 111, nose region 112, corners 114A and 114B, and detached correction feature 116 may have analogous structures, functions, and limitations as corresponding to mask 100, device feature 101 including nose region 102, corners 104A and 104B, and detached correction feature 106, respectively.

The mask 110 also includes the detached correction feature 116, which is shown as an aperture in opaque device feature 111. However, in another embodiment, the detached correction feature 116 might be opaque and at least partially surrounded by transparent regions. The detached correction feature 116 corresponds to the corners 114A and 114B. The correction feature 116 is detached because it is not physically connected to the corner 114A or the corner 114B, for which it is desired to provide optical proximity effect correction. In the embodiment shown, the detached correction feature 116 is an oval. However, other shapes, including but not limited to circles and other curved shapes, may be used. In addition, the shapes used may or may not be symmetric, depending upon the desired correction. The detached correction feature 116 is shown as symmetrically located. However, in another embodiment, the detached correction feature 116 may not be symmetrically located between the corners 114A and 114B. The detached correction feature 116 is sub-resolution in size for the electromagnetic radiation being used in performing lithography with the optical mask 110. Thus, the width and length of the detached correction feature 116 are such that the detached correction feature 116 is not printed on the mask (not shown in FIG. 6). In one embodiment, for example, the width of the detached correction feature 116 is not more than one hundred nanometers. The detached correction feature is in proximity to the corner(s) 114A/114B for which optical proximity correction is desired. For example, in one embodiment, the bottom of the detached correction feature 116 is not more than thirty nanometers above the apex of the corners 114A and 114B. However, the location and/or aspects of the detached correction feature 116 may depend upon the device being fabricated and the desired optical correction. For example, the size of the device, the size of the angles for the corners, and other features of the device may be accounted for in determining the size and/or shape of the detached correction feature 116. Finally, although the only the detached correction feature 116 is depicted, other correction features might also be provided.

In operation, the detached correction feature 116 modulates the intensity of the electromagnetic radiation used in performing lithography using the optical mask 110. At least one effect of the modulation in intensity is to improve the sharpness of the corners in a mask and device that correspond to the corners 114A and 114B. Other effects might but need not include improvements to other portions of the device feature 111.

Figure 7:
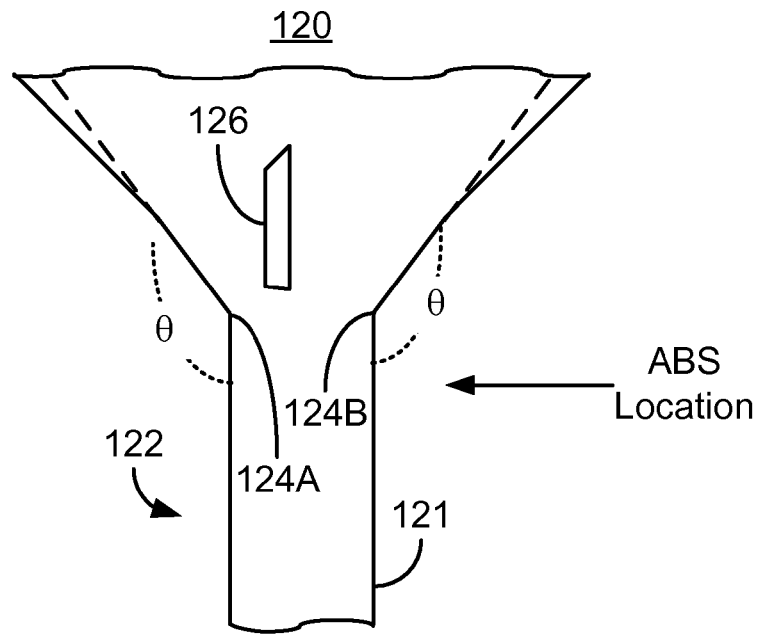
FIG. 7 depicts another exemplary embodiment of an optical mask used in fabricating structures having a corner, such as a PMR pole.

FIG. 7 depicts another exemplary embodiment of an optical mask 120 used in fabricating structures having a corner, such as a PMR pole. For clarity, FIG. 7 is not drawn to scale. The optical mask 120 corresponds to the optical masks 100/110. Consequently, analogous components have similar labels. The optical mask 120 thus includes a device feature 121 including a nose region 122, corners 124A and 124B, and detached correction feature 126 corresponding to device features 101/111 including nose regions 102/112, corners 104A/114A and 104B/114B, and detached correction features 106/116, respectively. Thus, the optical mask 120, device feature 121, nose region 122, corners 124A and 124B, and detached correction feature 126 may have analogous structures, functions, and limitations as corresponding to masks 100/110, device features 101/111 including nose regions 102/112, corners 104A/114A and 104B/114B, and detached correction feature 106/116, respectively.

The detached correction feature 126 is shown as an aperture in opaque device feature 121. However, in another embodiment, the detached correction feature 126 might be opaque and at least partially surrounded by transparent regions. The detached correction feature 126 corresponds to the corners 124A and 124B and is detached because it is not physically connected to the corner 124A or the corner 124B. In the embodiment shown, the detached correction feature 126 is an asymmetric trapezoid. However, other shapes may be used. In the embodiment shown, the detached correction feature is asymmetric in both shape and placement. However, the shape and/or location may or may not be symmetric, depending upon the desired correction. The detached correction feature 126 is sub-resolution in size for the electromagnetic radiation being used in performing lithography with the optical mask 120. Thus, the width and length of the detached correction feature 126 are such that the detached correction feature 126 is not printed on the mask (not shown in FIG. 7). In one embodiment, for example, the width of the detached correction feature 122 is not more than one hundred nanometers. The detached correction feature is in proximity to the corner(s) 124A/124B for which optical proximity correction is desired. For example, in one embodiment, the bottom of the detached correction feature 126 is not more than thirty nanometers above the apex of the corners 124A and 124B. However, the location and/or aspects of the detached correction feature 126 may depend upon the device being fabricated and the desired optical correction. Finally, although the only the detached correction feature 126 is depicted, other correction features might also be provided.

In operation, the detached correction feature 126 modulates the intensity of the electromagnetic radiation used in performing lithography using the optical mask 120. At least one effect of the modulation in intensity is to improve the sharpness of the corners in a mask and device that correspond to the corners 124A and 124B. Other effects might but need not include improvements to other portions of the device feature 121.

Figure 8:
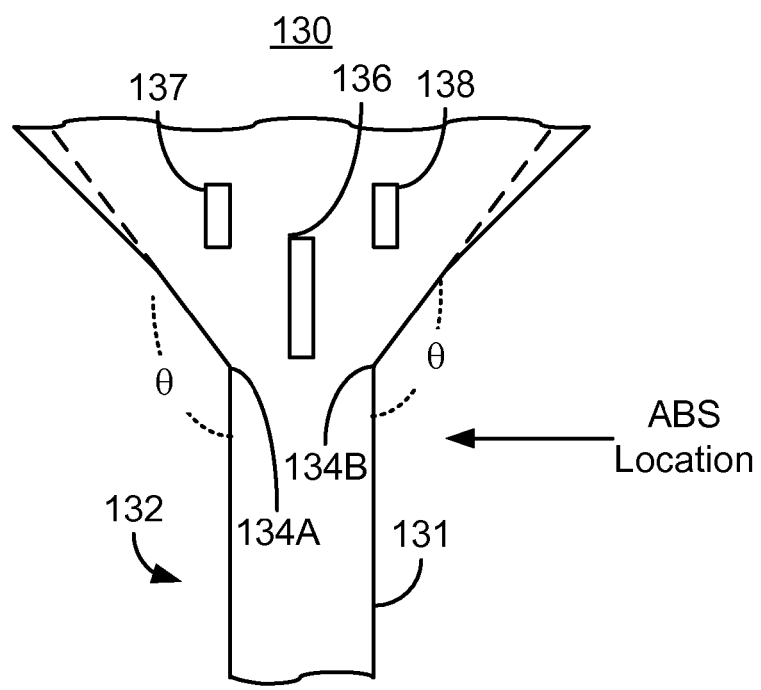
FIG. 8 depicts another exemplary embodiment of an optical mask used in fabricating structures having a corner, such as a PMR pole.

FIG. 8 depicts another exemplary embodiment of an optical mask 130 used in fabricating structures having a corner, such as a PMR pole. For clarity, FIG. 8 is not drawn to scale. The optical mask 130 corresponds to the optical masks 100/110/120. Consequently, analogous components have similar labels. The optical mask 130 thus includes a device feature 131 including a nose region 132, corners 134A and 134B, and detached correction features 136, 137, and 138 corresponding to device features 101/111/121 including nose regions 102/112/122, corners 104A/114A/124A and 104B/114B/124B, and detached correction features 106/116/126, respectively. Thus, the optical mask 130, device feature 131, nose region 132, corners 134A and 134B, and detached correction features 136 may have analogous structures, functions, and limitations as corresponding to masks 100/110/120, device features 101/111/121 including nose regions 102/112/122, corners 104A/114A/124A and 104B/114B/124B, and detached correction feature 106/116/126, respectively.

In the mask 130, there are multiple detached correction features 136, 137, and 138. The detached correction features 136, 137, and 138 are shown as apertures in opaque device feature 131. However, in another embodiment, the detached correction features 136, 137, and 138 might be opaque and at least partially surrounded by transparent regions. The detached correction features 136, 137, and 138 correspond to the corners 134A and 134B. These features 136, 137, and 138 are detached because they are not physically connected to the corner 134A or the corner 134B. Although shown as rectangles, other shapes may be used for any or all of the detached correction features 136, 137, and/or 138. In the embodiment shown, the detached correction features 136, 137, and 138 are symmetric in both shape and placement. For example, the correction features 137 and 138 have the same size and shape and are substantially equally spaced from the detached correction feature 136. However, the shape and/or placement of any of the detached correction features 136, 137, and/or 138 may or may not be symmetric. Each of the detached correction features 136, 137, and 138 is sub-resolution in size for the electromagnetic radiation being used in performing lithography with the optical mask 130. Thus, the width and length of the detached correction features 136, 137, and 138 are such that they are not printed on the mask (not shown in FIG. 8). The detached correction features 136, 137, and 138 are in proximity to the corner(s) 134A/134B for which optical proximity correction is desired. For example, in one embodiment, the bottom of the closest detached correction feature 136 is not more than thirty nanometers above the apex of the corners 134A and 134B. However, the location and/or aspects of the detached correction feature 136 may depend upon the device being fabricated and the desired optical correction.

In operation, the detached correction features 136, 137, and 138 modulate the intensity of the electromagnetic radiation used in performing lithography using the optical mask 130. At least one effect of the modulation in intensity is to improve the sharpness of the corners in a mask and device that correspond to the corners 134A and 134B. Other effects might but need not include improvements to other portions of the device feature 131.

Figure 9:
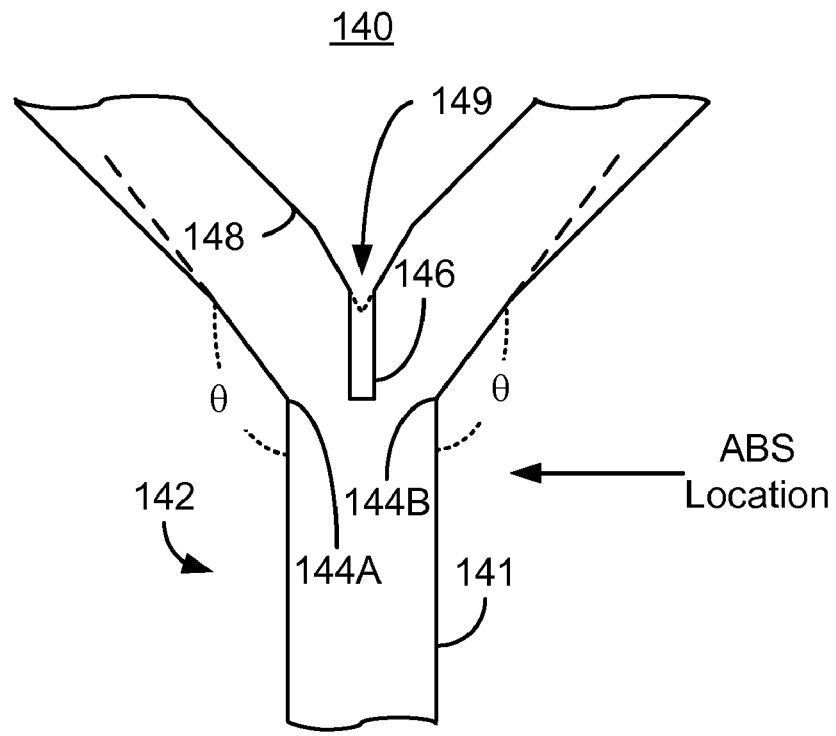
FIG. 9 depicts another exemplary embodiment of an optical mask used in fabricating structures having a corner, such as a PMR pole.

FIG. 9 depicts another exemplary embodiment of an optical mask 140 used in fabricating structures having a corner, such as a PMR pole. For clarity, FIG. 9 is not drawn to scale. The optical mask 140 corresponds to the optical masks 100/110/120/130. Consequently, analogous components have similar labels. The optical mask 140 thus includes a device feature 141 including a nose region 142, corners 144A and 144B, and detached correction feature 146 corresponding to device features 101/111/121/131 including nose regions 102/

112/122/132, corners 104A/114A/124A/134A and 104B/114B/124B/134B, and detached correction features 106/116/126/136, 137, and 138, respectively. Thus, the optical mask 140, device feature 141, nose region 142, corners 144A and 144B, and detached correction feature 146 may have analogous structures, functions, and limitations as corresponding to masks 100/110/120/130, device features 101/111/121/131 including nose regions 102/112/122/132, corners 104A/114A/124A/134A and 104B/114B/124B/134B, and detached correction feature 106/116/126/136, 137, and 138, respectively.

The detached correction feature 146 is shown as an aperture in opaque device feature 141. However, in another embodiment, the detached correction feature 146 might be opaque and at least partially surrounded by transparent regions. The detached correction feature 146 corresponds to the corners 144A and 144B and is considered detached because it is not physically connected to the corner 144A or the corner 144B. This is true even though the detached correction feature 146 is attached to another feature. In particular, the detached correction feature 146 is attached to corner 147 (shown in dotted lines), but not physically directly connected to the corners 144A and 144B. The detached correction feature 146 is a symmetric shape. However, other shapes may be used. In the embodiment shown, the detached correction feature is also symmetric in placement. However, the shape and/or location may or may not be symmetric, depending upon the desired correction. The detached correction feature 146 is also sub-resolution in size for the electromagnetic radiation being used in performing lithography with the optical mask 140. Thus, the width and length of the detached correction feature 146 are such that the detached correction feature 146 is not printed on the mask (not shown in FIG. 9). The location and/or aspects of the detached correction feature 146 may depend upon the device being fabricated and the desired optical correction. Finally, although the only the detached correction feature 146 is depicted, other correction features might also be provided. The detached correction feature 146 operates in an analogous manner to other detached correction features, by modulating the intensity of the electromagnetic radiation used in performing lithography. At least one effect of the modulation in intensity is to improve the sharpness of the corners in a mask and device that correspond to the corners 144A and 144B. Other effects might but need not include improvements to other portions of the device feature 141.

Thus, the masks 100, 110, 120, 130, and 140 may be used. Each of the masks 100, 110, 120, 130, and 140 uses detached correction features 106, 116, 126, 136-138, and 146. The detached correction features 106, 116, 126, 136-138, and 146 improve the sharpness of corners 104A, 104B, 114A, 114B, 124A, 124B, 134A, 134B, 144A, and 144B. Consequently, photolithography and electronic devices formed using the masks 100, 110, 120, 130, and 140 may be improved.

Because of the use of the detached correction features 106, 116, 126, 136-138, and 146, optical proximity effects can be reduced or eliminated. In particular, rounding of the corner of the resist mask corresponding to the corner of the mask may be reduced. Consequently, the geometry of the structure being formed may be closer to what is desired. For example, a PMR pole formed may have the desired track width and shape.

Figure 10:
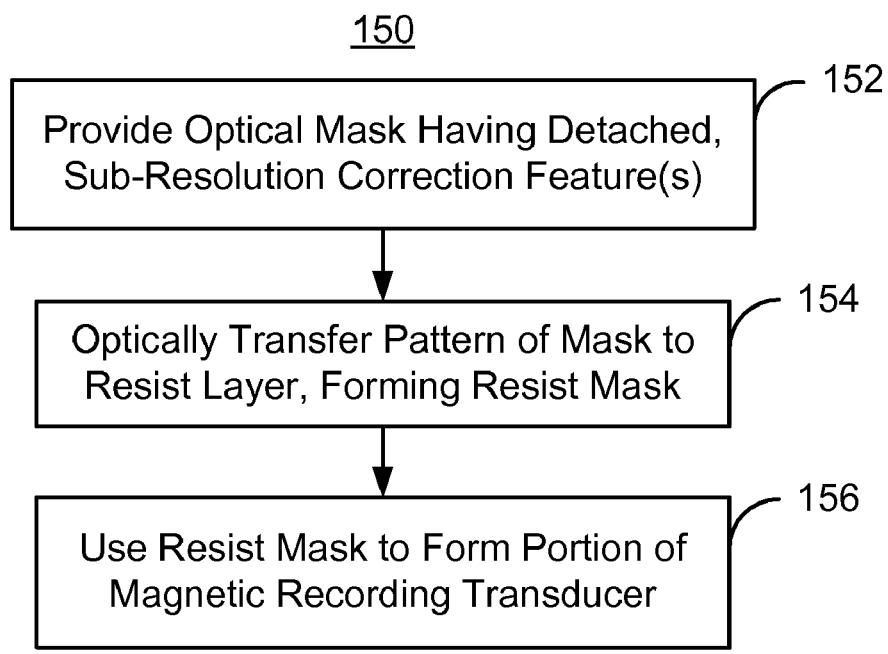
FIG. 10 is a flow chart depicting an exemplary embodiment of a method for forming structures having a corner, such as a PMR pole.

FIG. 10 is a flow chart depicting an exemplary embodiment of a method 150 for forming structures having a corner, such as a PMR pole, using optical mask(s) having detached correction features. An optical mask is provided, via step 152. The mask includes at least one corner that corresponds to an angle of greater than zero and less than one hundred eighty degrees. For example, such a corner may be one or more of the corners 104A, 104B, 114A, 114B, 124A, 124B, 134A, 134B, 144A, and 144B. In addition, the mask includes at least one detached correction feature, such as the feature 106, 116, 126, 136-138, and/or 146. The detached correction feature(s) 106, 116, 126, 136-138, and/or 146 are not physically connected to the corners 104A, 104B, 114A, 114B, 124A, 124B, 134A, 134B, 144A, and 144B for which the detached correction feature(s) 106, 116, 126, 136-138, and/or 146 are desired to provide optical correction. Although detached from the corners for which they are designed to provide correction, the detached correction features 106, 116, 126, 136-138, and/or 146 may be attached to another feature of the mask. The correction feature(s) are also sub-resolution in size.

The pattern in the optical mask is optically transferred from the mask to a resist layer to provide a resist mask, via step 154. Optical transfer includes exposing the resist layer to electromagnetic radiation, with portions of the resist layer covered by the mask 100, 110, 120, 130, and/or 140. Thus, the optical mask 100, 110, 120, 130, and/or 140 may be used.

Figure 11:
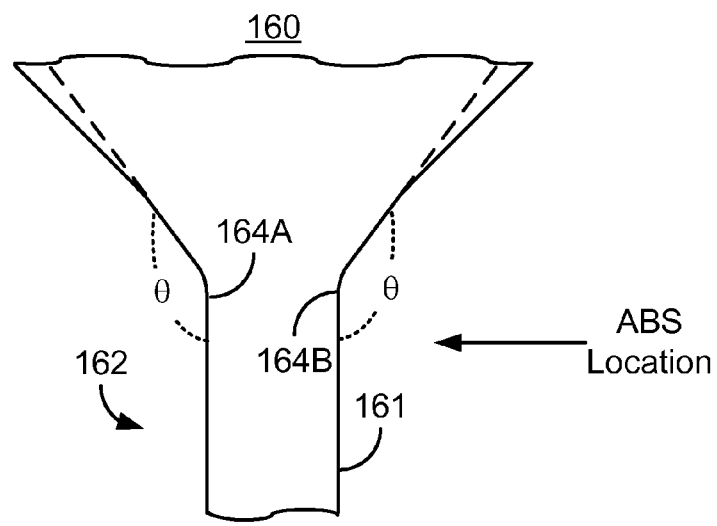
FIG. 11 depicts an exemplary embodiment of a photoresist mask used in fabricating structures having a corner, such as a PMR pole and formed using an exemplary embodiment of the mask.

FIG. 11 depicts an exemplary embodiment of a photoresist mask 160 used in fabricating structures having a corner, such as a PMR pole and formed using an exemplary embodiment of the mask 100, 110, 120, 130, and/or 140. In addition, the mask 160 may be formed using step 154 of the method 150. Thus, the mask 160 includes device feature 161 having a nose 162 and corners 164A and 164B that correspond to the device feature 101/111/121/131/141 having nose 102/112/122/132/142 and corners 104A/114A/124A/134A/144A and 104B/114B/124B/134B/144B, respectively. As can be seen in FIG. 11, the corners 164A and 164B, with angle θ, are significantly sharper than in the conventional mask 40. Further, the mask 160 contains no features corresponding to the detached correction features 106/116/126/136-138/146. This is because the detached correction features 106/116/126/136-138/146 are sub-resolution in size.

Referring back to FIG. 10, a portion of the magnetic recording transducer is formed using the resist mask, via step 156. For example, A PMR pole may be formed using the resist mask in step 156. In such an embodiment, the resist mask may include a line that is defined using the mask. The line may be used in forming the PMR pole. Alternatively, a trench may be formed. In addition, the mask 100, 110, 120, 130, and/or 140 and the resist mask 160 may be used in forming other structures, such as conductive lines.

Figure 12:
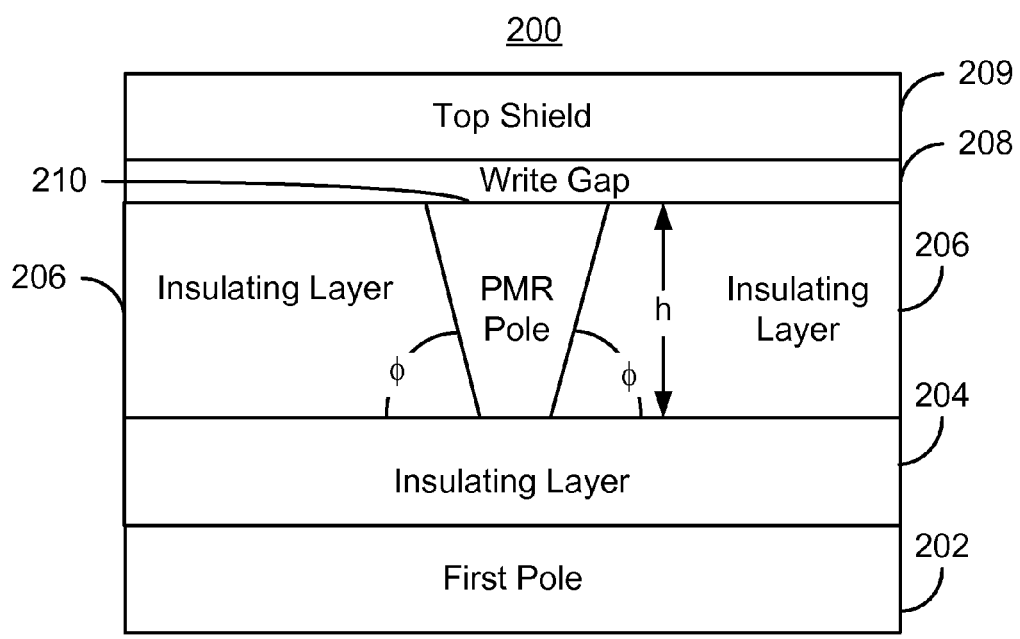
FIG. 12 depicts an ABS view of an exemplary embodiment of a PMR transducer.
Figure 13:
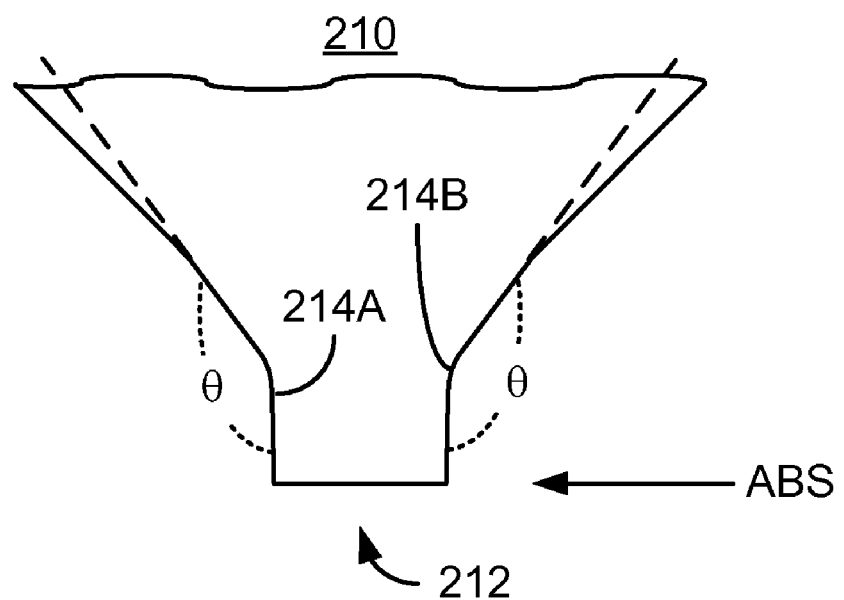
FIG. 13 depicts a top view of an exemplary embodiment of a PMR pole.

FIGS. 12-13 depict an exemplary embodiment of a PMR transducer formed using one or more of the optical masks 100, 110, 120, 130, and 140, resist mask 160, and the method 150, particularly step 156. FIG. 12 depicts an ABS view of an exemplary embodiment of a PMR transducer 200. FIG. 13 depicts a top view of an exemplary embodiment of the PMR pole. Although a PMR transducer is shown, the method 150 and optical masks 100, 110, 120, 130, and 140 might be used for other electronic devices. In such embodiments, the device features 101, 111, 121, 131, and 141 may have different configurations.

The PMR transducer 200 shown in FIGS. 12-13 is typically used as a write head in a merged head including the PMR transducer 200 and a read head. The PMR transducer 200 includes a first pole 202, insulator 204, insulator 206, a PMR pole (main pole) 210, write gap 208, and a top shield 209. The PMR pole 210 has a negative angle, φ. Thus, the top of the PMR pole 210 is wider than the bottom of the PMR pole 210. Near the ABS, the PMR pole 210 terminates in a nose 212. The PMR pole 210 thus flares outward from the nose 212 at a flare angle, θ, forming corners 214A and 214B. The flare angle may be between approximately one hundred ten degrees and one hundred sixty degrees in one embodiment. In another embodiment, the flare angle may be approximately one hundred and fifty degrees.

Because of the use of the detached correction features 106, 116, 126, 136-138, and/or 146, optical proximity effects may be reduced or eliminated for the mask 160 and thus the PMR pole 210. In particular, the corners 214A and 214B of the PMR pole 210 may have significantly less rounding. Consequently, the geometry of the nose 212 may be closer to what is desired. Thus, the control of the track width of the PMR transducer 200 and the geometry of the nose 212 may be improved. Consequently, performance and/or reliability of the magnetic transducer formed. Furthermore, the method 150, masks 100/110/120/130/140, and resist mask 160 may be extended to other structures in a magnetic recording transducer, or other electronic devices, which include corners. As a result, performance of the magnetic transducer, as well as other electronic devices, may be further enhanced.

A method and system for providing a mask and, therefore, a portion of a magnetic recording transducer has been disclosed. Using the method and system, a structure having sharper corners, improved geometry control and, therefore, a better defined track width has been described.

We claim:

1. An optical mask for providing a pattern for a portion of an electronic device, the optical mask comprising:
    a device feature including a corner corresponding to a device corner of the pattern, the device corner having an angle different from ninety degrees; and
    at least one detached correction feature residing in proximity to and physically separated from the corner, each of the at least one detached correction feature being sub-resolution, the at least one detached correction feature corresponding to the corner and the device corner.

2. The optical mask of claim 1 wherein the at least one detached correction feature is symmetric.

3. The optical mask of claim 1 wherein the at least one detached correction feature is asymmetric.

4. The optical mask of claim 1 wherein the at least one detached correction feature includes at least one of a detached bar and a detached square.

5. The optical mask of claim 1 wherein the at least one detached correction feature includes at least one of a detached oval and a detached circle.

6. The optical mask of claim 1 further comprising:
    an additional device feature separate from the device feature, the at least one detached correction feature being attached to the additional feature.

7. The optical mask of claim 1 wherein the at least one detached correction feature is optically opaque.

8. The optical mask of claim 1 wherein the optical mask includes an optically opaque portion having an aperture therein, the at least one detached correction feature corresponding to the aperture.

9. The optical mask of claim 1 wherein the electronic device is a magnetic recording transducer.

10. The optical mask of claim 9 wherein the magnetic recording transducer includes a perpendicular magnetic recording transducer.

11. An optical mask for providing a pattern for portion of a magnetic recording transducer, the optical mask comprising:
    a pole nose portion including a corner corresponding to a pole nose corner of the pattern, the pole nose corner having an angle of more than ninety degrees and less than one hundred eighty degrees; and
    at least one detached bar residing in proximity to and separate from the corner, each of the at least one detached bar being a sub-resolution feature, the at least one detached bar corresponding to the corner and the pole nose corner.

12. The optical mask of claim 11 further comprising:
    an additional pole feature separate from the nose portion, the at least one detached bar feature being attached to the additional pole feature.

13. A method for providing a pattern for portion of an electronic device comprising:
    providing an optical mask including a mask pattern having a device feature and at least one detached correction feature, the device corner having an angle different from ninety degrees, the at least one detached correction feature residing in proximity to and physically separated from the corner, each of the at least one detached correction feature being sub-resolution, the at least one detached correction feature corresponding to the corner and the device corner;
    optically transferring the mask pattern to a resist layer to provide a resist mask having the pattern; and
    forming the portion of the electronic device using the resist mask.

14. The method of claim 13 wherein the at least one detached correction feature is symmetric.

15. The method of claim 13 wherein the at least one detached correction feature is asymmetric.

16. The method of claim 13 wherein the at least one detached correction feature includes at least one of a detached bar and a detached square.

17. The method of claim 13 wherein the at least one detached correction feature includes at least one of a detached oval and a detached circle.

18. The method of claim 13 wherein the optical mask further includes an additional device feature separate from the device feature, the at least one detached correction feature being attached to the additional feature.

19. The method of claim 13 wherein the at least one detached correction feature is optically opaque.

20. The method of claim 13 wherein the optical mask includes an optically opaque portion having an aperture therein, the at least one detached correction feature corresponding to the aperture.

21. The method of claim 13 wherein the electronic device is a magnetic recording transducer.

22. The optical mask of claim 1 wherein the angle is greater than ninety degrees and less than one hundred and eighty degrees.

23. The optical mask of claim 1 wherein the at least one detached correction feature is configured to sharpen the device corner.

24. The optical mask of claim 11 wherein the at least one detached bar is configured to sharpen the pole nose corner.

25. The method of claim 13 wherein the angle is greater than ninety degrees and less than one hundred and eighty degrees.

26. The method of claim 13 wherein the at least one detached correction feature is configured to sharpen the device corner.

* * * * *